United States Patent [19]
Bowlby, Jr. et al.

[11] Patent Number: 5,268,567
[45] Date of Patent: Dec. 7, 1993

[54] CHARGE COLLECTION CONTROL CIRCUIT FOR USE WITH CHARGE-COUPLED PHOTODETECTOR ARRAYS

[75] Inventors: James O. Bowlby, Jr., San Jose; Gregory E. Johnston, Redondo Beach; Robert E. Malm, Pacific Palisades, all of Calif.

[73] Assignee: X-Ray Scanner Corporation, Torrance, Calif.

[21] Appl. No.: 981,507

[22] Filed: Nov. 25, 1992

[51] Int. Cl.⁵ .............................................. H01J 40/14
[52] U.S. Cl. ................................ 250/208.1; 358/213.31
[58] Field of Search ................. 250/208.1; 358/213.15, 358/213.16, 213.27, 213.28, 213.31, 213.26

[56] References Cited

U.S. PATENT DOCUMENTS 5,023,443  6/1991  Komatsu et al. ................. 250/208.1
5,055,667 10/1991  Sayag ............................... 250/208.1

Primary Examiner—David C. Nelms
Attorney, Agent, or Firm—Robert E. Malm

[57] ABSTRACT

The charge collection control circuit generates a time-varying voltage that is used to control the charge collection process in an MOS photodetector for the purpose of obtaining greater dynamic range. Control is exercised either by means of an integration control electrode that controls the flow of charge from a charge-collecting region to a sink or by means of a transfer electrode that controls the flow of charge from the charge-collecting region to a charge-transport region through which the collected charge flows to an output circuit.

29 Claims, 3 Drawing Sheets

CHARGE COLLECTION CONTROL CIRCUIT FOR USE WITH CHARGE-COUPLED PHOTODETECTOR ARRAYS

BACKGROUND OF INVENTION

This invention relates generally to solid-state photodetectors wherein photogenerated minority carriers are collected in storage potential wells. More specifically, the invention relates to methods, circuits, and apparatus for controlling and reading out arrays of such photodetectors.

A metal-oxide-semiconductor (MOS) sandwich structure wherein the metal electrode is insulated from the semiconductor substrate by a thin oxide layer can function as a light detector under appropriate circumstances. If a voltage of appropriate polarity is applied across the MOS device, the majority carriers are removed from the semiconductor region that is closest to the metal electrode and a potential well is formed that is capable of storing minority carriers. Photons that pass through the thin metal electrode and into the semiconductor are absorbed, thereby freeing minority carriers that are collected in the potential well. The number of minority carriers that are collected in the potential well is a measure of the number of photons that have entered the semiconductor. Equivalently, the number of collected minority carriers is a linear measure of the intensity of the light to which the device has been exposed. The term MOS, as used herein, is intended to include structures wherein another conducting material is substituted for the metal and another insulator is substituted for the oxide.

The MOS photodetector is used to measure the intensity of incident light by (1) dumping any charge that is present in the well, (2) exposing the photodetector to the light for an interval of time, and (3) measuring the charge collected in the well at the completion of the exposure. The minimum light intensity $I_{min}$ that can be measured is limited by thermally-generated minority carriers that collect in the well during the exposure. The maximum light intensity $I_{max}$ that can be measured is usually limited by the quantity of charge that can be stored in the potential well. The resulting dynamic range of an MOS photodetector is equal to $I_{max}/I_{min}$.

For many applications it is desirable that the charge collected in the potential well of an MOS photodetector be a non-linear monotonically-increasing function of light intensity in order to increase $I_{max}$ and the dynamic range of the device. This approach can also provide improved measurement precision at low light intensities.

A method of achieving non-linear functional relationships between collected charge and light intensity is described by Sayag in U.S. Pat. No. 5,00,667 issued Oct. 8, 1991 which is incorporated by reference. The essence of the method is to bleed off charge from the potential well as charge collects in the well during exposure to light. The amount of charge bled off during the exposure is made to depend on the light intensity—the amount being increasingly larger as the intensity becomes larger.

The present invention provides a means for practicing the method described by Sayag and also includes a method of charge collection control not disclosed by Sayag.

BRIEF SUMMARY OF INVENTION

The charge collection control circuit is intended for use with photodetectors having metal-oxide-semiconductor (MOS) structures. The typical MOS photodetector is comprised of two regions: (1) a charge-collecting region where the charge generated in the semiconductor, by exposure to incident light is stored; and (2) a charge-transport region to which charge originating in the charge-collecting region can be transferred for readout. The transfer of charge from charge-collecting region to charge-transport region is accomplished by placing an appropriate voltage on a transfer electrode.

Some MOS photodetectors include a sink region to which charge above a certain level in the charge-collecting region can be bled off so as not to exceed the charge capacity of the charge-transport region. The bleeding of charge from the charge-collecting region to the sink region is controlled by the voltage placed on the integration control electrode.

It is customary to operate an MOS photodetector during the charge-collecting phase with a voltage level on the transfer electrode that prevents charge in the charge-collecting region from moving to the charge-transport region. During the readout phase the voltage placed on the transfer electrode causes all of the charge in the charge-collecting region to transfer to the charge-transport region. The voltage on the integration control electrode is usually fixed.

A fixed integration control voltage results in the collected charge during an exposure being proportional to light intensity up to a saturation light intensity. The collected charge is independent of light intensity for intensities above the saturation light intensity.

By varying the integration control voltage in an appropriate fashion during the exposure of the photodetector to light, a nonlinear relationship between collected charge and incident light intensity can be obtained and the dynamic range of the photodetector can be significantly increased.

It has been discovered that a similar result can be achieved by varying the transfer voltage during the exposure of the photodetector to light.

The charge collection control circuit controls the charge collection process in the charge-collecting region by supplying a time-varying voltage tailored for either the integration control electrode or the transfer electrode. A compact representation of the appropriate time-varying voltage function is either communicated to or stored in the control circuit. The control circuit generates the desired voltage function from the representation for each exposure of the photodetector to light. The invention also includes the method of charge collection control utilizing the transfer electrode of the photodetector.

DESCRIPTION OF THE PREFERRED EMBODIMENT

A typical charge-coupled photodetector array consists of a linear array of closely-spaced MOS photodetectors and an adjacent analog shift register composed of charge-coupled devices (CCDs). The photodetectors are coupled to adjacent CCDs in the shift register so that the charges collected in the photodetector potential wells can be transferred to the adjacent CCDs and read out by shifting the charges analog the shift register to an output circuit. Some charge-coupled photodetector arrays also include a sink region, accessible to each photodetector, for either preventing charge from collecting in the photodetector potential wells or getting rid of charge that may exceed the capacity of the CCD potential wells to which the photodetector-collected charge is periodically transferred.

Figure 1:
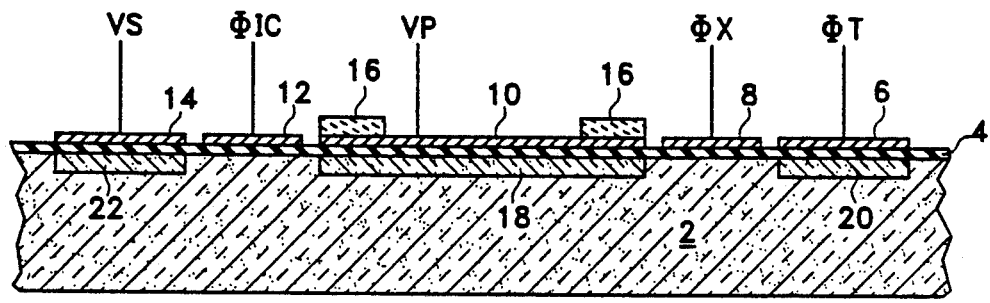
FIG. 1 shows the structure of an MOS photodetector having a charge-collecting region, a charge-transport region, and a sink region.

The structure of a single photodetector, its associated shift register CCD, and the sink is shown in FIG. 1. The structure consists of a semiconductor substrate 2, a thin oxide layer 4, and electrodes 6, 8, 10, 12, and 14. Charge is generated by light passing between light shields 16 through electrode 10 and into semiconductor region 18. A voltage VP is applied to electrode 10 thereby establishing a potential well and enabling minority carriers to accumulate in semiconductor region 18. All voltages are referenced to substrate 2. It is assumed for purposes of discussion that, the substrate is at zero potential.

Semiconductor region 20 beneath electrode 6 is part of the shift register that provides the means for shifting the photodetector charges out of the photodetector array. The voltage $\Phi T$ applied to electrode 6 is programmed to permit storage of charge during charge transfer from region 18 to region 20 and to facilitate transfer of charge along the shift register during read-out. A voltage $\Phi X$ applied to transfer electrode 8 provides the means for controlling the flow of charge between regions 18 and 20.

Semiconductor region 22 beneath electrode 14 is a sink region for charge generated in region 18. The voltage VS applied to electrode 14 establishes a potential well for receiving charge from region 18. A voltage $\Phi IC$ applied to integration control electrode 12 controls the flow of charge between regions 18 and 22.

If voltage $\Phi IC$ is zero, the charge collected in region 18 cannot flow into region 22. If voltage $\Phi IC$ is equal to or greater than the voltage VP (and VS is greater than VP), the region 18 charge empties into region 22. If voltage $\Phi IC$ is set to some intermediate value, charge will collect in region 18 until the collected charge modifies the potential just beneath the collected charge in region 18 to equal the potential at the oxide-semiconductor interface beneath electrode 12 at which time any further generated charge will flow into region 22. Thus, the voltage $\Phi IC$ determines the maximum charge that can be collected in region 18.

A voltage $\Phi IC$ that decreases from a predetermined maximum absolute value to zero during the exposure time establishes a maximum level of collected charge in region 18 as a function of time, the maximum level of collected charge ranging from near zero to an overall maximum value. The maximum voltage value is usually chosen such that the overall maximum level of collected charge in region 18 represents the maximum charge that can be transferred to region 20 without overflowing. If the voltage $\Phi IC$ varies in such a way as to cause the slope of the maximum level of collected charge as a function of time to continually increase with time, an increased dynamic range of the device results. Further details of this method can be obtained from Sayag referenced above.

Figure 2:
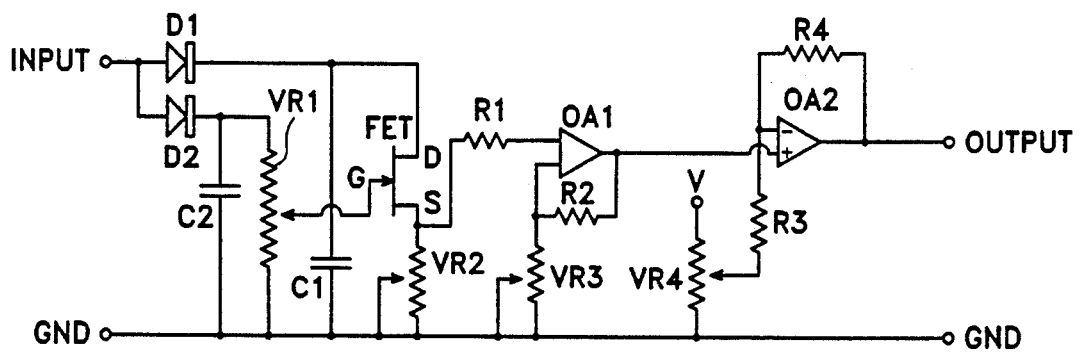
FIG. 2 shows an analog embodiment of the charge collection control circuit.

A charge collection control circuit which transforms a rectangular input pulse into a shaped pulse having a duration equal to the desired integration time (i.e. exposure time) and having the attributes specified in the preceding paragraph is shown in FIG. 2.

The input pulse is of sufficient duration to completely charge capacitors C1 and C2 through diodes D1 and D2 respectively. The charge stored in C2 leaks off through variable resistor VR1 which provides a voltage proportional to the discharge current to the gate G of the field effect transistor FET.

If the voltage at gate G is zero, capacitor C1 will discharge through the field effect transistor FET and the voltage at source S will remain constant until the voltage on drain D drops below the voltage on gate G, at which time the voltage at, source S will quickly ramp to zero. By moving the tap on variable resistor VR1 above ground, a small decaying signal is applied to gate G of field effect transistor FET with the result that the voltage at source S ramps downward slowly at first and then rapidly toward the end of the integration period.

The transition point between the slow and fast ramps is controlled by the position of the VR1 tap. The overall integration time is controlled by the tap position of variable resistor VR2.

The operational amplifier OA1 provides gain at a level controlled by the tap position of variable resistor VR3. The operational amplifier, OA2 provides the means for offsetting the OA1 output by adjusting the position of the tap of variable resistor VR4.

The charge collection control circuit of FIG. 2 was tested with the Loral-Fairchild CCD181, a 2592-element photodetector array designed for industrial measurement, telecine, and document scanning applications which require high resolution, high sensitivity and high data rate. The individual cells of the device are structured as shown in FIG. 1. The Loral-Fairchild CCD181DB Design Development Board was vised in testing the circuit with the CCD181 device. The evaluation board was modified to provide a longer transfer pulse to allow enough time for C1 and C2 to completely charge.

The active devices used in the circuit were as follows: D1 and D2, 1N4152; FET, J108: OA1 and OA2, LM324. The values of the passive devices were as follows: C1=0.022 $\mu$F, C2=0.022 $\mu$F, VR1=10 k$\Omega$, VR2=10 k$\Omega$, VR3=1 k$\Omega$, VR4=5 k$\Omega$, R1=5 k$\Omega$, R2=2 k$\Omega$, R3=50 k$\Omega$, R4=50 k$\Omega$. The taps of the variable resistors were set to the following resistance values: VR1 tap=400 $\Omega$, VR2 tap=6 k$\Omega$, VR3 tap=0.7 k$\Omega$, VR4 tap=0 k$\Omega$.

The output of the circuit decreased from 8 volts to ground over a period equal to the entire integration period.

Ambient light of approximately 50 foot-candles resulted in 0.26 volts at the output of the CCD181 when the output of the charge collection control circuit was connected to the integration control electrode of the CCD181. A fluorescent lamp producing approximately 2000 foot-candles placed directly over the CCD181 resulted in 0.68 volts at the output. The maximum available output from the CCD181 was 0.95 volts.

With a constant 8 volts applied to the integration control electrode 12 (FIG. 1) rather than the charge collection control voltage from the circuit of FIG. 2, exposure of the CCD181 to 130 foot-candles resulted in an output of 0.68 volts.

Thus, the use of the circuit of FIG. 2 increased the dynamic range of the CCD181 by a factor of 15.4 (i.e. 2000 foot-candles divided by 130 foot candles).

Figure 3:
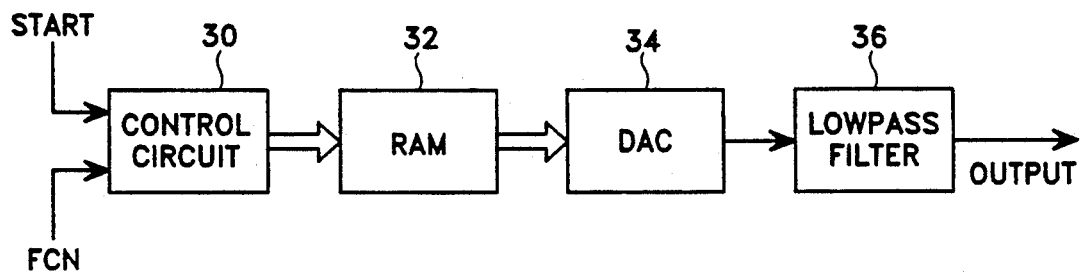
FIG. 3 shows a digital embodiment of the charge collection control circuit that utilizes a RAM for the storage of the representation of the charge collection control function.

An alternative embodiment, of the charge collection control circuit is shown in FIG. 3. The control circuit 30 provides the means for storing in the RAM 32 12-bit amplitude samples of the charge collection control function supplied at initial startup by the imaging system in which the charge-coupled photodetector array is used. The imaging system supplies 8192 amplitude samples equispaced over the exposure period though the number is not critical. RAM 32 is either a single RAM or a combination of RAMs having 13 address lines and 12 data lines.

The clock input in conjunction with the start input causes the control circuit 30 to generate a sequence of addresses which are supplied to RAM 32 and cause the RAM to produce digital representations of the amplitude samples of the charge collection control function in proper order. The clock frequency equals the number of samples times the reciprocal of the exposure time so that the complete sequence of amplitude samples is read out during the exposure time. The range of exposure times is governed by the specifications of the charge-coupled photodetector array with which the charge collection control circuit is to be used.

At the conclusion of a readout of the amplitude samples, the address of the first sample is maintained on the RAM address lines until the start signal once again occurs at which time the sequence of amplitude samples is once again read out. This procedure avoids the occurrence of a transient at the output of the charge collection control circuit when the generation of the charge collection control function begins. RAM 32 must, of course, have a response time that is short compared to the clock period.

The sequence of digital amplitude samples from RAM 32 are converted to a stepped analog function by means of the 12-bit digital-to-analog converter (DAC) 34. The DAC 34 must also have a response time that is short compared to the clock period and must produce an output voltage large enough to meet the integration control voltage range specification for the charge-coupled photodetector array with which the charge collection control circuit is to be used.

A particular embodiment of the charge collection control circuit of FIG. 3 for use with the Loral-Fairchild CCD181 charge-coupled photodetector array utilized two 8-bit RAMs (Cypress Semiconductor Corp., 7C185) for RAM 32 and for DAC 34 and lowpass filter 36, a 12-bit DAC (Analog Devices Inc., 9713B), which sinks current from a 2-volt reference thereby producing a 0 to 2 volt output, in combination with an operational amplifier with a gain of 4.9 (Elantek, Inc., EL2041) that expands the DAC voltage range to 0 to 9.8 volts (consonant with the voltage range of 0 to 8 volts specified for the CCD181 integration control electrode).

Figure 4:
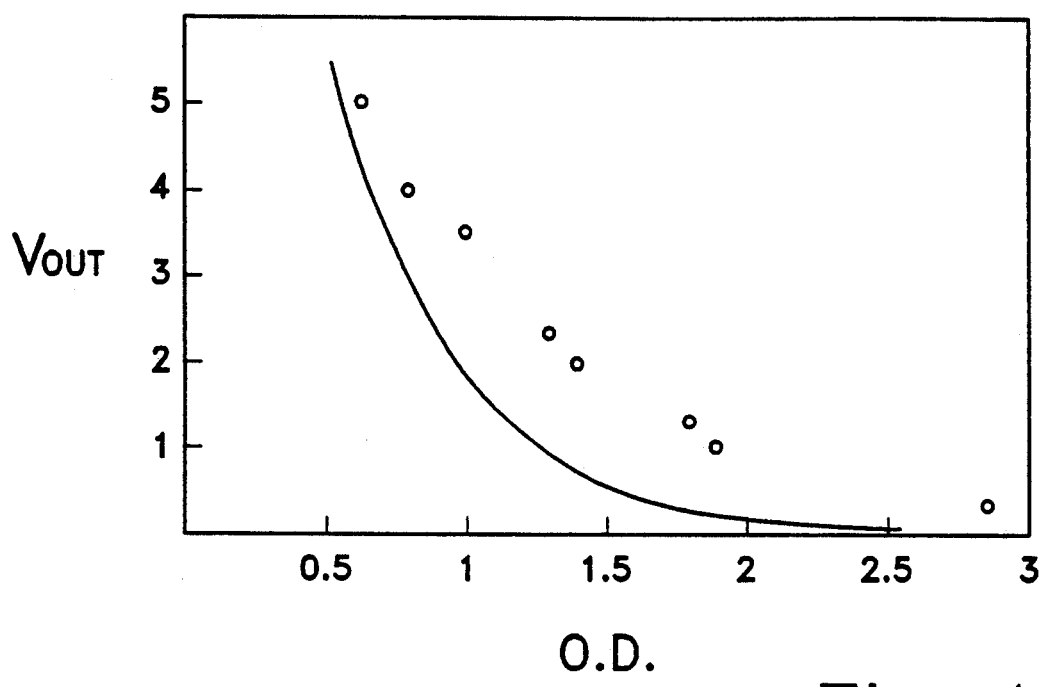
FIG. 4 shows experimental results obtained with a digital embodiment of the charge collection control circuit controlling the integration control electrode of the Loral-Fairchild CCD181 line image sensor using the control function defined by equation (1).

The results of testing this configuration with the charge collection control function.

$$VC = VS \frac{e^{Kt} - 1}{e^K - 1} \qquad (1)$$

are shown in FIG. 4. The exposure time extends from $t=0$ to $t=1$, $K=5$, and $VS=1$. The abscissa is optical density—the logarithm to the base 10 of the reciprocal of light intensity to which the CCD181 was exposed. The ordinate is the output voltage of the CCD181. The solid curve is the theoretical output voltage with no bleeding of charge from region 18 to region 22 (FIG. 1). The solid dots are the results obtained when using the charge collection control circuit to limit the charge collected in region 18. The expansion of dynamic range through the use of the charge collection control circuit should be noted.

The charge collection control circuit was also tested using the charge collection control function $$VS = \begin{cases} -V0 \ln(1 - t) & ; \; t < 1 - V0/VMAX \\ VSAT - VMAX(1 - t) & ; \; t \geq 1 - V0/VMAX \end{cases}$$

where $$VMAX = V0 \, e^{(VSAT/V0 - 1)}$$

Figure 5:
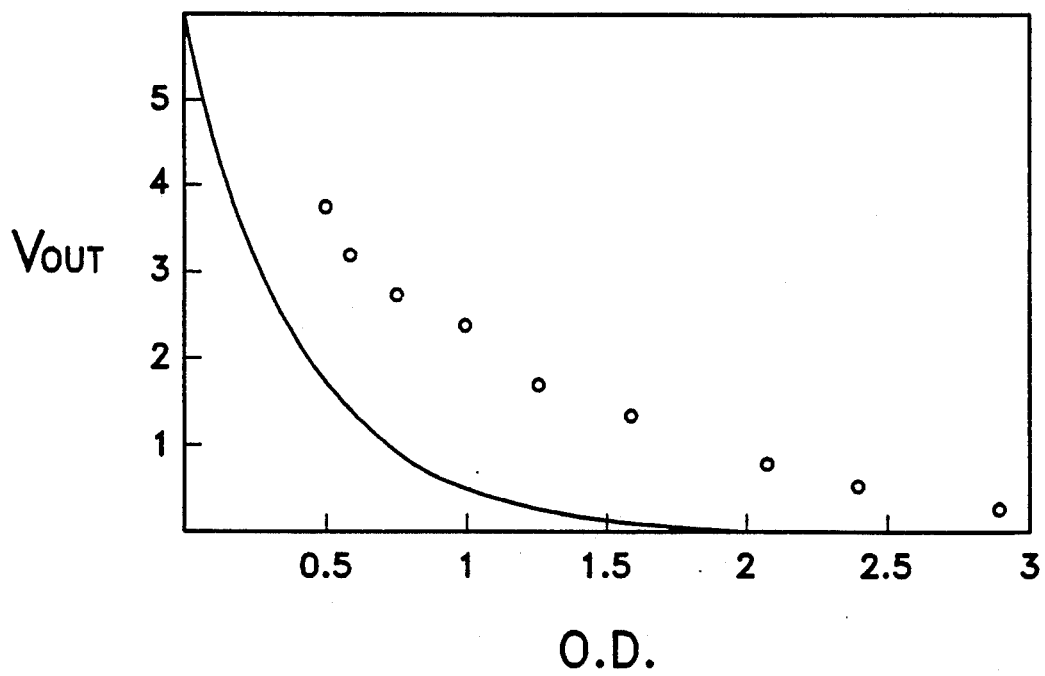
FIG. 5 shows experimental results obtained with a digital embodiment of the charge collection control circuit controlling the integration control electrode of the Loral-Fairchild CCD181 line image sensor using the control function defined by equation (2).

The results shows in FIG. 5 were obtained for $V0=0.15$ and $VSAT=1$. The solid curve again is the theoretical output voltage with no bleeding of charge from region 18 to region 22 (FIG. 1). The solid dots are the results obtained when using the charge collection control circuit to limit the charge collected in region 18. The expansion of dynamic range through the use of the charge collection control circuit again should be noted.

Figure 6:
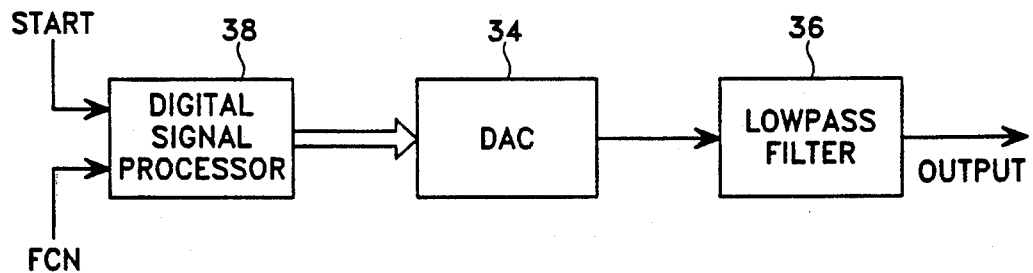
FIG. 6 shows a digital embodiment of the charge collection control circuit that utilizes a digital signal processor for generating the charge collection control function.

An alternative to the embodiment shown in FIG. 3 is used when the charge collection control function can be expressed in terms of standard functions such as logarithms, cosines, sines, exponentials, etc. The alternative embodiment is shown in FIG. 6.

The DAC 34 and the lowpass filter 36 are the same devices discussed in connection with FIG. 3. The digital signal processor 38 accepts a functional description of the charge collection control function and generates amplitude values of the function at time intervals equal to exposure time divided by 8192 in the preferred embodiment. The clock frequency is chosen large enough to perform an amplitude calculation in the time allotted.

After generating the complete charge collection control function, the DSP 38 continually presents the first amplitude sample at its output until another start signal is received at which time it recalculates and outputs each of the amplitude samples once again.

Many charge-coupled photodetector arrays do not have region 22 (FIG. 1) which acts a sink for excess charge generated in region 18. However, an equally-satisfactory avenue for disposing of charge is region 20 which forms part of the shift register that is used for transporting the charge generated in region 18 to an output circuit. The method consists of: (1) applying the voltage generated by the charge collection control circuit to electrode 8 during an exposure; (2) isolating the shift register CCDs from the photodetectors at the end of the exposure by holding electrode 8 at 0 volts while the charge bled off from region 18 to region 20 during step 1 is shifted to one end of the shift register and disposed of by the output circuit; (3) applying a fixed voltage to electrode 8 to cause the charge collected in region 18 to transfer to region 20; (4) isolating the shift register CCDs from the photodetectors by holding electrode 8 at 0 volts while the charge transferred from region 18 to region 20 in step (3) is shifted to one end of the shift, register and read out by means of the output circuit; and (5) repeating steps (1) through (5).

The particular embodiment of the charge collection control circuit shown in FIG. 3 and using the charge collection control function defined by equation (1) was tested with the Toshiba CCD143D charge-coupled photodetector array. Results similar to those shown in FIGS. 4 and 5 were obtained.

An alternative method which avoids one set of shift register charge transfers consists of: (1) applying the voltage generated by the charge collection control circuit to electrode 8 during an exposure; (2) isolating the shift register CICDs from the photodetectors at the end of the exposure by holding electrode 8 at 0 volts and then reducing the voltage applied to electrode 6 to 0, thereby collapsing the potential well in region 20 and dissipating the charge beld off from region 18 to region 20 during step 1; (3) restoring the voltage applied to electrode 6 to its normal value thereby reestablishing the potential well in region 20 and applying a voltage to electrode 8 of sufficient magnitude to cause the charge collected in region 18 to transfer to region 20; (4) isolating the shift register CCDs from the photodetectors by holding electrode 8 at 0 volts while the charge transferred from region 18 to region 20 in step (3) is shifted to one end of the shift register and read out by means of the output circuit; and (5) repeating steps (1) through (5).

What is claimed is:

1. A charge collection control circuit for use with an imaging system comprising a plurality of photodetector cells, each photodetector cell comprising a charge-collecting region, a charge-transport region, a sink region, an integration control electrode, and a transfer electrode, said charge-collecting region being used to store charge generated by light incident on said cell during each of a plurality of exposures, all of said exposures being equal in duration, said imaging system generating a start signal at the beginning of each exposure, said sink region being used as a means for disposing of excess charge in said charge-collecting region, said charge-transport region being used to receive and temporarily store charge collected in said charge-collecting region, the transfer of charge from said charge-collecting region to said sink region being controlled during an exposure by a charge collection control voltage applied to said integration control electrode, the magnitude of said charge collection control voltage at a particular time establishing the amount of charge that can be stored in said charge-collecting region at said particular time, the transfer of charge from said charge-collecting region to said charge-transport region being controlled by a transfer voltage applied to said transfer electrode, the transfer of charge being accomplished by a change in said transfer voltage from a first value to a second value, said charge collection control circuit comprising:

a means for storing a representation of a charge collection control function, said function being a continuous function of time defined for a time period extending from zero to a time equal to the duration of an exposure;

a means for retrieving said representation from said storing means and generating said charge collection control voltage from said stored representation each time a start signal is inputted, the zero reference time of said representation corresponding to the time at which said start signal is inputted.

2. The charge collection control circuit of claim 1 wherein said charge collection control function has an initial value at time zero and a final value at time equal to the exposure duration, the rate of change of said function having the same sign as the difference between said final value and said initial value.

3. The charge collection control circuit of claim 2 wherein the absolute value of the rate of change of said function remains constant or increases with time.

4. The charge collection control circuit of claim 1 wherein said representation of said charge collection control function is a set of values of said function in a binary number format obtained at equal intervals of time, said storing means is a read-only memory (ROM), and said retrieving-generating means is the combination of an address generator, a digital-to-analog converter (DAC), and a lowpass filter, said address generator causing the function values to appear, on the data lines of said ROM in time sequence at said equal intervals of time when said start signal is inputted, said DAC converting said binary values appearing on the data lines of said ROM to analog voltages, the charge collection control voltage represented by said analog voltages being obtained by passing said analog voltages through said lowpass filter.

5. The charge collection control circuit of claim 1 wherein said charge collection control function is represented by a mathematical expression, said storing means and said retrieving-generating means are a digital signal processor, a digital-to-analog converter (DAC), and a lowpass filter, said representation being stored in said digital signal processor, said digital signal processor computing the values of said function from said stored representation at equal intervals of time when said start signal is inputted and causing said computed values to appear on the input lines of said DAC, said DAC converting said computed values appearing on the input lines of said DAC to analog voltages, the charge collection control voltage represented by said analog voltages being obtained by passing said analog voltages through said lowpass filter.

6. The charge collection control circuit of claim 1 wherein said charge collection control function is represented by a circuit comprising active and passive devices, said storing means and said retrieving-generating means are a pulse generator and said function representing circuit, said pulse generator producing a rectangular pulse having a duration equal to said exposure duration when said start signal is inputted, said pulse being fed into said function-representing circuit, said function representing circuit producing at its output said charge collection control voltage.

7. A charge collection control circuit for use with an imaging system comprising a plurality of photodetector cells, each photodetector cell comprising a charge-collecting region, a charge-transport region, a sink region, an integration control electrode, and a transfer electrode, said charge-collecting region being used to store charge generated by light incident on said cell during each of a plurality of exposures, all of said exposures being equal in duration, said imaging system generating a start signal at the beginning of each exposure, said sink region being used as a means for disposing of excess charge in said charge-collecting region, said charge-transport region being used to receive and temporarily store charge collected in said charge-collecting region, the transfer of charge from said charge-collecting region to said sink region being controlled during an exposure by a charge collection control voltage applied to said integration control electrode, the magnitude of said charge collection control voltage at a particular time establishing the amount of charge that can be stored in said charge-collecting region at said particular time, the transfer of charge from said charge-collecting region to said charge-transport region being controlled by a transfer voltage applied to said transfer electrode, the transfer of charge being accomplished by a change in said transfer voltage from a first value to a second value, said charge collection control, circuit comprising:

a function generator adapted to receive as inputs a start signal and a representation of a charge collection control function from said imaging system, said representation being supplied by said imaging system at startup to said function generator, said function generator obtaining values of said charge collection control function in binary format from said representation in time sequence at equal intervals of time when a start signal is inputted;

a digital-to-analog converter (DA(,) which converts the binary function values from said function generator into analog voltages;

a lowpass filter which smooths the analog voltages from said DAC to obtain said charge collection control voltage.

8. The charge collection control circuit of claim 7 wherein said function generator is comprised of:

a control circuit adapted to receive as inputs a start signal and a representation of a charge collection control function from said imaging system, said representation being supplied to said control circuit by said imaging system at startup, said representation being values in a binary format of said charge collection control function at equal intervals of time;

a random-access memory (RAM) having address lilies and data lines, said control circuit causing said function values to be stored in said RAM at startup, said control circuit generating addresses in RAM of binary function values in time sequence at said equal intervals of time when a start signal is inputted, said addresses being placed on said RAM address lines, said binary function values appearing on said RAM data lines and being supplied to said DAC.

9. The charge collection control circuit of claim 7 wherein said function generator is comprised of:

a digital signal processor, said representation of said charge collection control function being a mathematical expression supplied to said digital signal processor by said imaging system at startup, said digital signal processor obtaining the values of said charge collection control function by calculations using said mathematical expression.

10. A charge collection control circuit for use with an imaging system comprising a plurality of photodetector cells, each photodetector cell comprising a charge-collecting region, a charge-transport region, a sink region, an integration control electrode, and a transfer electrode, said charge-collecting region being used to store charge generated by light incident on said cell during each of a plurality of exposures, all of said exposures being equal in duration, said imaging system generating a start signal at the beginning of each exposure, said start signal being a rectangular pulse having a duration equal to the duration of an exposure, said sink region being used as a means for disposing of excess charge in said charge-collecting region, said charge-transport region being used to receive and temporarily store charge collected in said charge-collecting region, the transfer of charge from said charge-collecting region to said sink region being controlled during an exposure by a charge collection control voltage applied to said integration control electrode, the magnitude of said charge collection control voltage at a particular time establishing the amount of charge that can be stored in said charge-collecting region at said particular time, the transfer of charge from said charge-collecting region to said charge-transport region being controlled by a transfer voltage applied to said transfer electrode, the transfer of charge being accomplished by a change in said transfer voltage from a first value to a second value, said charge collection control circuit comprising:

a pulse shaping network adapted to receive a start pulse from said imagine system;

a voltage amplifier, the input to said voltage amplifier being the output of said pulse shaping network, said voltage amplifier causing the range of voltages at the input to be amplified by a predetermined factor at the output;

a voltage shifter, the input to said voltage shifter being the output of said voltage amplifier, the output of said voltage shifter being said charge collection control voltage, said voltage shifter causing the range of voltages at the input to be shifted by a predetermined fixed voltage at the output.

11. A charge collection control circuit for use with an imaging system comprising a plurality of photodetector cells, each photodetector cell comprising a charge-collecting region, a charge-transport region, and a transfer electrode, said charge-collecting region being used to store charge generated by light incident on said cell during each of a plurality of exposures, all of said exposures being equal in duration, said imaging system generating a start signal at the beginning of each exposure, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport regions being charge-coupled in a shift register configuration thereby permitting charge transferred from said charge-collecting regions to said charge-transport regions to be transported to an output circuit at the end of said shift register, said charge collection control circuit comprising:
- a means for storing a representation of a charge collection control function, said function being a continuous function of time defined for a time period extending from zero to a time equal to the duration of an exposure;
- a means for retrieving said representation from said storing means and generating said charge collection control voltage from said representation each time a start signal is inputted, the zero reference time of said representation corresponding to the time at which said start signal is inputted.

12. The charge collection control circuit of claim 11 wherein said charge collection control function has an initial value at time zero and a final value at time equal to the exposure duration, the rate of change of said function having the same sign as the difference between said final value and said initial value.

13. The charge collection control circuit of claim 12 wherein the absolute value of the rate of change of said function remains constant or increases with time.

14. The charge collection control circuit of claim 11 wherein said representation of said charge collection control function is a set of values of said function in a binary number format obtained at equal intervals of time, said storing means is a read-only memory (ROM), and said retrieving-generating means is the combination of an address generator, a digital-to-analog converter (DAC), and a lowpass filter, said address generator causing the function values to appear on the data lines of said ROM in time sequence at said equal intervals of time when said start signal is inputted, said DAC converting said binary values appearing on the data lines of said ROM to analog voltages, the charge collection control voltage represented by said analog voltages being obtained by passing said analog voltages through said lowpass filter.

15. The charge collection control circuit of claim 11 wherein said charge collection control function is represented by a mathematical expression, said storing means and said retrieving-generating means are a digital signal processor, a digital-to-analog converter (DAC), and a lowpass filter, said representation being stored is said digital signal processor, said digital signal processor computing the values of said function from said stored representation at equal intervals of time when said start signal is inputted and causing said computed values to appear, on the input lines of said DAC, said DAC converting said computed values appearing on the input lines of said DAC to analog voltages, the charge collection control voltage represented by said analog voltages being obtained by passing said analog voltages through said lowpass filter.

16. The charge collection control circuit of claim 11 wherein said charge collection control function is represented by a circuit comprising active and passive devices, and said storing means and said retrieving-generating means are a pulse generator and said function representing circuit, said pulse generator producing a rectangular pulse having a duration equal to said exposure duration when said start signal is inputted, said pulse being fed into said function-representing circuit, said function representing circuit producing at its output said charge collection control voltage.

17. A charge collection control circuit for use with an imaging system comprising a plurality of photodetector cells, each photodetector cell consisting of a charge-collecting region, a charge-transport region, and a transfer electrode, said charge-collecting region being used to store charge generated by light incident on said cell during each of a plurality of exposures, all of said exposures being equal in duration, said imaging system generating a start signal at the beginning of each exposure, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport regions being charge-coupled in a shift register configuration thereby permitting charge transferred from said charge-collecting regions to said charge-transport regions to be transported to an output circuit at the end of said shift register, said charge collection control circuit comprising:
- a function generator adapted to receive as inputs a start signal and a representation of a charge collection control function from said imaging system at startup, said function generator obtaining values of said charge collection control function in binary format from said representation in time sequence at equal intervals of time when said start signal is inputted;
- a digital-to-analog converter (DAC) which converts the binary function values from said function generator into analog voltages;
- a lowpass filter which smooths the analog voltages from said DAC to obtain said charge collection control voltage.

18. The charge collection control circuit of claim 17 wherein said function generator is comprised of:
- a control circuit adapted to receive as inputs a start signal and a representation of a charge collection control function from said imaging system at startup, said control circuit obtaining values of said charge collection control function from said representation in binary format and in time sequence at equal intervals of time when said start signal is inputted;
- a random-access memory (RAM) having address lines and data lines, said representation of said charge collection control function being values of said charge collection control function at equal intervals of time in a binary format, said control circuit causing said function values to be stored in said RAM, said control circuit generating addresses in RA51 of binary function values in time sequence at said equal intervals of time when said start signal is inputted, said addresses being placed on said RAM address lines, said binary function values appearing on said RAM data lines being supplied to said DAC.

19. The charge collection control circuit of claim 17 wherein said function generator is comprised of:

a digital signal processor, said representation of said charge collection control function being a mathematical expression supplied by said imaging system at startup to said digital signal processor, said digital signal processor obtaining the values of said charge collection control function by calculations using said mathematical expression.

20. A charge collection control circuit for use with an imaging system comprising a plurality of photodetector cells, each photodetector cell consisting of a charge-collecting region, a charge-transport region, and a transfer electrode, said charge-collecting region being used to store charge generated by light incident on said cell during each of a plurality of exposures, all of said exposures being equal in duration, said imaging system generating a start signal at the beginning of each exposure, said start signal being a rectangular pulse having a duration equal to the duration of an exposure, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport regions being charge-coupled in a shift register configuration thereby permitting charge transferred from said charge-collecting regions to said charge-transport regions to be transported to an output circuit at the end of said shift register, said charge collection control circuit comprising:

a pulse shaping network adapted to receive a start pulse from said imaging system;

a voltage amplifier, the input to said voltage amplifier being the output of said pulse shaping network, said voltage amplifier causing the range of voltages at the input to be amplified by a predetermined factor at the output;

a voltage shifter, the input to said voltage shifter being the output of said voltage amplifier, the output of said voltage shifter being said charge collection control voltage, said voltage shifter causing the range of voltages at the input to be shifted by a predetermined fixed voltage at the output.

21. A nonlinear light detector for use in an imaging system, said light detector comprising:

a photodetector cell consisting of a charge-collecting region, a charge-transport region, a sink region, and integration control electrode, and a transfer electrode, said charge-collecting region being used to store charge generated by light incident on said cell during each of a plurality of exposures, all of said exposures being equal in duration, said imaging system generating a start signal at the beginning of each exposure, said sink region being used as a means for disposing of excess charge in said charge-collecting region, said charge-transport region being used to receive and temporarily store charge collected in said charge-collecting region, the transfer of charge from said charge-collecting region to said sink region being controlled during an exposure by a charge collection control voltage applied to said integration control electrode, the magnitude of said charge collection control voltage at a particular time establishing the amount of charge that can be stored in said charge-collecting region at said particular time, the transfer of charge from said charge-collecting region to said charge-transport region being controlled by a transfer voltage applied to said transfer electrode, the transfer of char-re being accomplished by a change in said transfer voltage from a first value to a second value;

a means for storing a representation of a charge collection control function, said function being a continuous function of time defined for a time period extending from zero to a time equal to the duration of an exposure;

a means for retrieving said representation from said storing means and generating said charge collection control voltage from said stored representation each time a start signal is inputted, the zero reference time of said representation corresponding to the time at which said start signal is inputted.

22. A nonlinear light detector array for use in an imaging system, said light detector array comprising:

a plurality of photodetector cells, each of said cells consisting of a charge-collecting region, a charge-transport region, and a transfer electrode, said charge-collecting region being used to store charge generated by light incident on said cell during each of a plurality of exposures, all of said exposures being equal in duration, said imaging system generating a start signal at the beginning of each exposure, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport regions being charge-coupled to form a shift register configuration thereby permitting charges transferred from said charge-collecting regions to said charge-transport regions to be shifted along said shift register and through an output circuit at the end of said shift register;

a means for storing a representation of a charge collection control function, said function being a continuous function of time defined for a time period extending from zero to a time equal to the duration of an exposure;

a means for retrieving said representation from said storing means, generating said charge collection control voltage from said stored representation each time said imaging system produces said start signal, and applying said charge collection control voltage to said transfer electrode, the zero reference time of said representation corresponding to the time at which said start signal is inputted;

a means for causing the shifting of charges stored in said shift register to an output circuit, said charge-transport regions being emptied of charge at the end of an exposure by shifting the charges contained in said charge-transport regions along said shift register and through said output circuit, said charge-collecting regions being emptied of charge after said charge-transport regions have been emptied, said charge-collecting regions being emptied into said charge-transport regions by application of said emptying voltage to said transfer electrode, the charges emptied from said charge-collecting regions into said charge-transport regions being shifted along said shift register and through said output circuit.

23. A nonlinear light detector array for use in an imaging system, said light detector array comprising:

a plurality of photodetector cells, each of said cells comprising a charge-collecting region, a charge-transport region, a transfer electrode, and a transport region electrode, said charge-collecting region being used to store charge generated by light incident on said cell during each of a plurality of exposures, all of said exposures being equal in duration, said imaging system generating a start signal at the beginning of each exposure, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport region being emptied of charge by application of a transport-region emptying voltage to said transport region electrode, said transport-region emptying voltage causing the charge stored in said transport-region to disappear, said charge-transport regions being charge-coupled to form a shift register configuration thereby permitting charges transferred from said charge-collecting regions to said charge-transport regions to be shifted along said shift register and through an output circuit at the end of said shift register;

a means for storing a representation of a charge collection control function, said function being a continuous function of time defined for a time period extending from zero to a time equal to the duration of an exposure;

a means for retrieving said representation from said storing means, generating said charge collection control voltage from said stored representation each time said imaging system produces said start signal, and applying said charge collection control voltage to said transfer electrode, the zero reference time of said representation corresponding to the time at which said start signal is received from said imaging system;

a means for causing the shifting of charges stored in said shift register to an output circuit, said charge-transport regions being emptied of charge at the end of an exposure by application of said transport-region emptying voltage to said transport region electrode, said charge-collecting regions being emptied of charge after said charge-transport regions have been emptied, said charge-collecting regions being emptied into said charge-transport regions by application of said charge-collecting region emptying voltage to said transfer electrode, the charges emptied from said charge-collecting regions into said charge-transport regions being shifted along said shift register and through said output circuit.

24. A method for obtaining nonlinear responses from a plurality of charge-coupled photodetector cells, each of said photodetector cells comprising a charge-collecting region, a charge-transport region, and a transfer electrode, said charge-collecting region being used to store charge generated by light incident on said cell during each of a plurality of exposures, all of said exposures being equal in duration, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge when a charge-collecting region emptying voltage is applied to said transfer electrode, said charge-collecting region emptying voltage being equal to a value that causes all charge stored in said charge-collecting region to move to said charge-transport region, said charge-transport regions being charge-coupled to form a shift register configuration thereby permitting charges transferred from said charge-collecting regions to said charge-transport regions to be shifted along said shift register and through an output circuit at the end of said shift register, said method comprising the following steps for each exposure:

causing said charge collection control voltage to change continuously from an initial level at the start of an exposure to a final level at the end of said exposure, thereby establishing a varying limit on the amount of charge that can be stored in said charge-collecting regions during an exposure, the charge in excess of said varying limit being bled off into said charge-transport regions;

emptying said charge-transport regions at the end of an exposure by shifting the charges contained in said charge-transport regions along said shift register and through said output circuit;

emptying said charge-collecting regions into said charge-transport regions by application of said charge-collecting region emptying voltage to said transfer electrode;

shifting the charges emptied from said charge-collecting regions into said charge-transport regions along said shift register and through said output circuit.

25. A method for obtaining nonlinear responses from a plurality of charge-coupled photodetector cells, each of said photodetector cells comprising a charge-collecting region, a charge-transport region, a transfer electrode, and a transport region electrode, said charge-collecting region being used to store charge generated by light incident on said cell during each of a plurality of exposures, all of said exposures being equal in duration, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport region being emptied of charge by application of a transport-region emptying voltage to said transport region electrode, said transport-region emptying voltage causing the charge stored in said transport-region to disappear, said charge-transport regions being charge-coupled to form a shift register configuration thereby permitting charges transferred from said charge-collecting regions to said charge-transport regions to be shifted along said shift register and through an output circuit at the end of said shift register;

causing said charge collection control voltage to change continuously from an initial level at the start of an exposure to a final level at the end of said exposure, thereby establishing a varying limit on the amount of charge that can be stored in said charge-collecting regions during an exposure, the charge in excess of said varying limit being bled off into said charge-transport regions;

emptying said charge-transport regions of charge at the end of an exposure by application of said transport-region emptying voltage to said transport region electrode;

emptying the charges in said charge-collecting regions into said charge-transport regions by application of said charge-collecting region emptying voltage to said transfer electrode;

shifting the charges emptied from said charge-collecting regions into said charge-transport regions along said shift register and through said output circuit.

26. A method of using a charge collection control circuit with an imaging system comprising a plurality of photodetector cells, each photodetector cell consisting of a charge-collecting region, a charge-transport region, a sink region, an integration control electrode, and a transfer electrode, said charge-collecting region being used to store charge generated by light incident on said cell during each of a plurality of exposures, all of said exposures being equal in duration, said imaging system generating a start signal at the beginning of each exposure, said sink region being used as a means for disposing of excess charge in said charge-collecting region, said charge-transport region being used to receive and temporarily store charge collected in said charge-collecting region, the transfer of charge from said charge-collecting region to said sink region being controlled during an exposure by a charge collection control voltage applied to said integration control electrode, the magnitude of said charge collection control voltage at a particular time establishing the amount of charge that can be stored in said charge-collecting region at said particular time, the transfer of charge from said charge-collecting region to said charge-transport region being controlled by a transfer voltage applied to said transfer electrode, the transfer of charge being accomplished by a change in said transfer voltage from a first value to a second value, said charge collection control circuit comprising:

a function generator adapted to receive as inputs a start signal and a representation of said charge collection control function from said imagine&, system, said representation being supplied by said imaging system at startup, said function generator obtaining values of said char.-le collection control function in binary format from said representation in time sequence at equal intervals of time when said start signal is received from said imaging system;

a digital-to-analog converter (DAC) which converts the binary function values from said function generator into analog voltages;

a lowpass filter which smooths the analog voltages from said DAC to obtain said charge collection control voltage, said charge collection control voltage appearing at the output of said charge collection control circuit;

said method comprising the steps:

incorporating in said imaging system a means for obtaining a representation of said charge collection control function;

incorporating in said imaging system a means for communicating said representation and said exposure start signal to said charge collection control circuit;

connecting the output of said charge collection control circuit to the integration control electrodes of said imaging system.

27. A method for using a charge collection control circuit with an imaging system comprising a plurality of photodetector cells, each photodetector cell comprising a charge-collecting region, a charge-transport region, and a transfer electrode, said charge-collecting region being used to store charge generated by light incident on said cell during each of a plurality of exposures, all of said exposures being equal in duration, said imaging system generating a start signal at the beginning of each exposure, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport regions being charge-coupled in a shift register configuration thereby permitting charge transferred from said charge-collecting regions to said charge-transport regions to be shifted along said shift register and through an output circuit at the end of said shift register, said charge collection control circuit comprising:

a function generator adapted to receive as inputs a start signal and a representation of said charge collection control function from said imaging system, said representation being supplied by said imaging system at startup, said function generator obtaining values of said charge collection control function in binary format from said representation in time sequence at equal intervals of time when said start signal is received from said imaging system;

a digital-to-analog converter (DAC) which converts the binary function values from said function generator into analog voltages;

a lowpass filter which smooths the analog voltages from said DAC to obtain said charge collection control voltage, said charge collection control voltage appearing at the output of said charge collection control circuit;

said method comprising the steps:

incorporating in said imaging system a means for obtaining a representation of said charge collection control function;

incorporating in said imaging system a means for communicating said representation and said exposure start signal to said charge collection control circuit;

connecting the output of said charge collection control circuit to the transfer electrodes of said imagine, system;

incorporating in said imagine system a means for emptying said charge-transport regions at the end of an exposure by shifting the charges contained in said charge-transport regions along said shift register and through said output circuit;

incorporating in said imaging system a means for emptying said charge-collecting regions into said charge-transport regions by application of said charge-collecting region emptying voltage to said transfer electrode;

incorporating in said imaging system a means for shifting the charges emptied from said charge-collecting regions into said charge-transport regions along said shift register and through said output circuit.

28. A method for limiting the responses from a plurality of charge-coupled photodetector cells, each of said photodetector cells comprising a charge-collecting region, a charge-transport region, and a transfer electrode, said charge-collecting region being used to store charge generated by light incident on said cell during each of a plurality of exposures, all of said exposures being equal in duration, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge when a charge-collecting region emptying voltage is applied to said transfer electrode, said charge-collecting region emptying voltage being equal to a value that causes all charge stored in said charge-collecting region to move to said charge-transport region, said charge-transport regions being charge-coupled to form a shift register configuration thereby permitting charges transferred from said charge-collecting regions to said charge-transport regions to be shifted along said shift register and through an output circuit at the end of said shift register, said method comprising the following steps for each exposure:

causing said charge collection control voltage to have a constant value during an exposure, thereby establishing a fixed limit on the amount of charge that can be stored in said charge-collecting regions during an exposure, the charge in excess of said varying limit being bled off into said charge-transport regions;

emptying said charge-transport regions at the end of an exposure by shifting the charges contained in said charge-transport regions along said shift register and through said output circuit;

emptying said charge-collecting regions into said charge-transport regions by application of said charge-collecting region emptying voltage to said transfer electrode;

shifting the charges emptied from said charge-collecting regions into said charge-transport regions along said shift register and through said output circuit.

29. A method for limiting the responses from a plurality of charge-coupled photodetector cells, each of said photodetector cells comprising a charge-collecting region, a charge-transport region, a transfer electrode, and a transport region electrode, said charge-collecting region being used to store charge generated by light incident on said cell during each of a plurality of exposures, all of said exposures being equal in duration, said charge-transport region being used to receive and temporarily store charge collected in said charge-collecting region, the transfer of charge from said charge-collecting region to said charge-transport region being controlled during an exposure by a charge collection control voltage applied to said transfer electrode, the magnitude of said charge collection control voltage at a particular time establishing the amount of charge that can be stored in said charge-collecting region at said particular time, said charge-collecting region being emptied of charge by application of a charge-collecting region emptying voltage to said transfer electrode, said charge-collecting region emptying voltage being equal to a value that causes all charge stored in said charge-collecting region to move to said charge-transport region, said charge-transport region being emptied of charge by application of a transport-region emptying voltage to said transport region electrode, said transport-region emptying voltage causing the charge stored in said transport-region to disappear, said charge-transport regions being charge-coupled to form a shift register configuration thereby permitting charges transferred from said charge-collecting regions to said charge-transport regions to be shifted along said shift register and through an output circuit at the end of said shift register;

causing said charge collection control voltage to have a constant value during an exposure, thereby establishing a fixed limit on the amount of charge that can be stored in said charge-collecting regions during an exposure, the charge in excess of said varying limit being bled off into said charge-transport regions;

emptying said charge-transport regions of charge at the end of an exposure by application of said transport-region emptying voltage to said transport region electrode;

emptying the charges in said charge-collecting regions into said charge-transport regions by application of said charge-collecting region emptying voltage to said transfer electrode;

shifting the charges emptied from said charge-collecting regions into said charge-transport regions along said shift register and through said output circuit.

* * * * *